United States Patent

[11] 3,614,592

[72] Inventor John T. Redfern
La Jolla, Calif.
[21] Appl. No. 877,721
[22] Filed Nov. 18, 1969
[45] Patented Oct. 19, 1971
[73] Assignee The United States of America as represented by the Secretary of the Navy

[54] CYCLOCONVERTER USING BIDIRECTIONAL SEMICONDUCTOR SWITCHES

1 Claim, 3 Drawing Figs.

[52] U.S. Cl. .......... 321/69 R, 307/252 B, 321/5
[51] Int. Cl. .......... H02m 5/30
[50] Field of Search .......... 321/5, 7, 58, 69; 307/252 B

[56] References Cited

UNITED STATES PATENTS

| | | | |
|---|---|---|---|
| 3,287,622 | 11/1966 | Eckenfelder et al. .......... | 321/69 |
| 3,328,606 | 6/1967 | Pinckaers .......... | 321/45 DT |
| 3,436,641 | 4/1969 | Biringer .......... | 321/69 X |
| 3,436,642 | 4/1969 | Segsworth .......... | 321/69 X |
| 3,493,838 | 2/1970 | Gyugyi et al. .......... | 321/69 X |
| 3,360,713 | 12/1967 | Howell .......... | 307/252 B |
| 3,493,783 | 2/1970 | Till .......... | 307/252 B |

*Primary Examiner*—William M. Shoop, Jr.
*Attorneys*—Richard S. Sciascia, Ervin F. Johnston and Thomas G. Keough

ABSTRACT: Polyphase power in the form of commercially available three-phase electric power is converted to a single lower frequency by providing a single bidirectional semiconductor serially interposed in each of the branches of a wye or delta transformer secondary. Gate control unipolar trigger pulses are produced when polarity coincidence occurs between the component of polyphase power appearing across each of the branches and a control frequency having its frequency lower than that of the polyphase power. Selective gating of each bidirectional semiconductor forms a composite signal across a commonly connected load in accordance with the frequency of a control signal.

INVENTOR.
JOHN T. REDFERN

BY

Thomas G. Keough
Ervin F. Johnston
ATTORNEYS

INVENTOR.
JOHN T. REDFERN
BY
Thomas G. Keough
Ervin F. Johnston
ATTORNEYS

CYCLOCONVERTER USING BIDIRECTIONAL SEMICONDUCTOR SWITCHES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Contemporary polyphase frequency conversion circuits include a needless multiplicity of components especially in applications where the conversion is to a lower frequency. Gas discharge tubes, such as thyratrons, are duplicated and arranged in a parallel relationship in separate unidirectional circuits to accommodate bidirectional signals for full-wave frequency conversion. Similarly, one-way semiconductor switches, such as silicon controlled rectifiers, require separate parallel arrangements for full-wave conversion. With parallel thyratrons or SCR's, dual gating circuitry is also required to further complicate matters, since the multiplicity of components inherently yields a lower reliability.

SUMMARY OF THE INVENTION

The present invention is directed to providing an apparatus for converting polyphase power to a composite signal including a plurality of branches inductively receiving separate polyphase components, shifted in phase from one another. A source of control frequency is fed to gating circuits along with the separate components of the polyphase power to generate unipolar trigger pulses whenever a polarity coincidence occurs between the control frequency and the component of polyphase power. The unipolar trigger pulses are fed to a serially interposed, gated bidirectional semiconductor in each of the branches to pass only predetermined portions of the polyphase component. A load connected in parallel across all the branches functions as an adder to form the above-referred to composite signal.

Therefore, it is an object of the present invention to provide a polyphase frequency converter formed of a minimal amount of components.

Yet another object is to provide a frequency converter including only a single bidirectional semiconductor per phase identically actuated to pass impressed components of polyphase power of either polarity.

A further object is to provide a frequency converter having gating circuitry responsive to polarity and magnitude coincidence between an impressed control frequency and a polyphase component to generate unipolar trigger pulses.

These and other objects of the instant invention will become readily apparent from a detailed examination of the ensuing description when taken with the drawings.

DESCRIPTION OF THE PREFERRED EMBODIMENT

Figure 1:
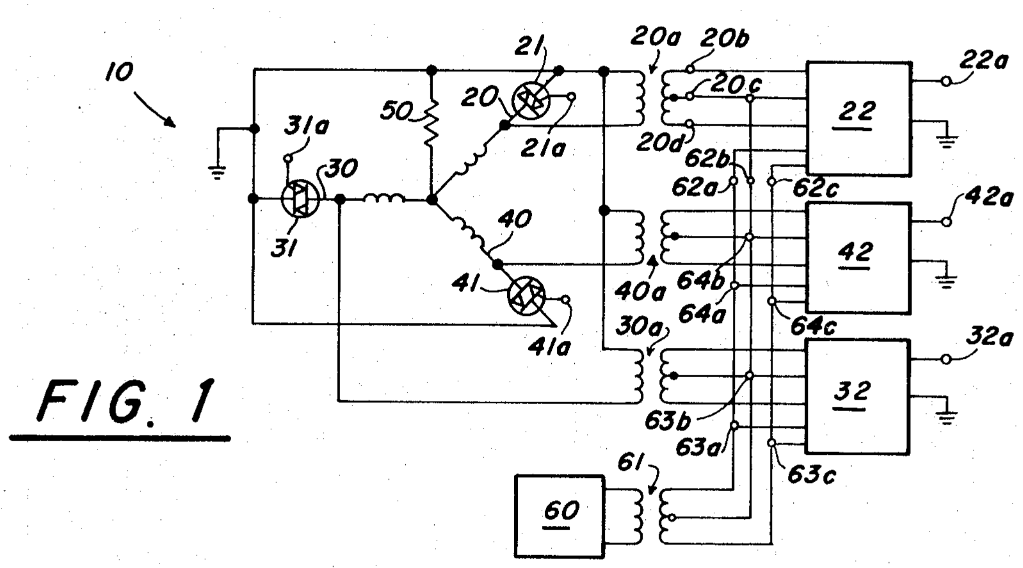
FIG. 1 depicts a schematic representation of the instant invention.

Referring now to FIG. 1 of the drawings, reference character 10 generally designates the secondary of a conventional polyphase transformer, in this case a three-phase transformer secondary arranged in a wye configuration composed of branches 20, 30, and 40. As in the conventional wye arrangement, a load in the form of machinery, arc-welding apparatuses, or in this particular application, the energizing source of a low-frequency transducer, is generically represented by a load 50 connected in parallel across the three branches of the transformer secondary. Here, although the representative depiction sets out a wye configured transformer secondary, a delta or more sophisticated inductive coupling arrangement in either the primary or secondary windings optionally employs the present inventive concept in accordance with the requirements of a particular job at hand.

Serially interposed in each of the transformer secondary branches, a gated bidirectional semiconductor 21, 31, or 41 is provided to selectively pass its respectively impressed polyphase component to transfer across load 50 a composite signal formed of selectively gated portions of all the polyphase components. Bidirectional semiconductors are commercially marketed under the generic name of thyristor or silicon triacs, as well as a number of other well-known commercial names, each having the capability for bidirectional conduction when negative gating pulses are fed to its gate while its main terminals are suitably biased.

Three component signals 12, 13, and 14 are impressed across branches 20, 30, and 40, respectively and each are fed to its associated trigger circuit 22, 32, or 42 via a coupling transformer **20*a*, 30*a*, or 40*a***, respectively.

The exact time when the negative gating pulses turn "on" the bidirectional semiconductors depends on two things: the instant of polarity coincidence between each component of polyphase power 12, 13, or 14 and a control frequency **60*a* generated in a source 60, and the relative magnitude of the control frequency. Polarity coincidence and relative control frequency magnitude all compared and determined in separately associated trigger circuits 22, 32, or 42** which, consequently, produce the gating pulses.

Generation of gating pulses indicative of discrete instants of polarity coincidence is explained with reference to a representative trigger circuit 22 and its passing the signals to a gate **21*a* interconnected to gate pulse output terminal 22*a***, it being noted that the terminal to gate interconnection lead is not shown to simplify the drawings.

Figure 2:
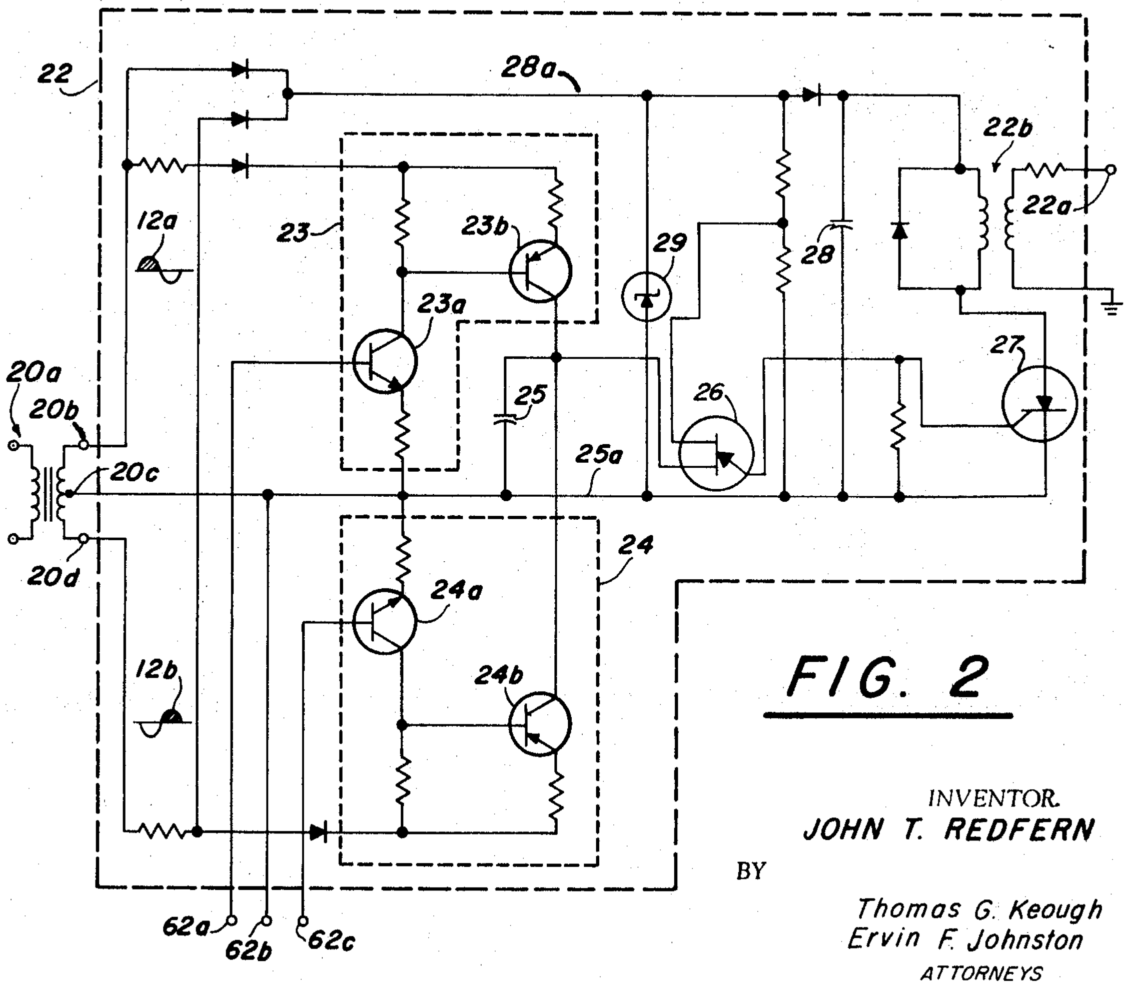
FIG. 2 is a circuit diagram setting forth details in the unipolar trigger pulse producing circuit.
Figure 3:
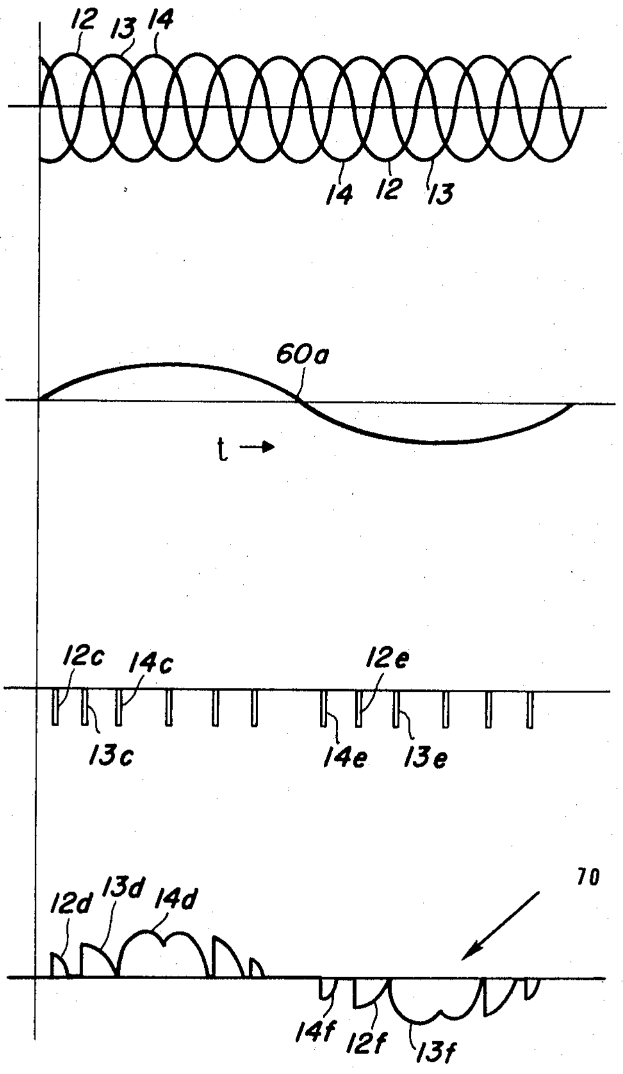
FIG. 3 depicts waveform coincidence with respect to time among the impressed and generated signals.

Referring specifically now to FIG. 2, trigger circuit 22 is shown in detail to expedite an understanding as to how the negative trigger pulses are generated and passed to gate **21*a*. At terminal points 20*b* and 20*d*, coupling transformer 20*a* provides subcomponents 12*a* and 12*b* of the impressed component 12 differing from each other by a phase shift of 180°. Identical subcomponent 12*a* and shifted subcomponent 12*b* are fed to alternately charge a charging capacitor 28 via a common lead 28*a*. A Zener diode 29, connected between common lead 28*a* and a lead 25*a* extending from a center tap 20*c*, clamps the charging capacitor to a predetermined magnitude equal to the trigger pulse magnitude, as well as clamping a pair of internal trigger units 23 and 24** to a predetermined biasing potential.

Within each of the trigger units, pairs of transistors **23*a* and 23*b*, and 24*a* and 24*b* are coupled to receive either subcomponent 12*a* or 12*b* as well as receiving control signal 60*a* from either terminal 62*a* or 62*c*, respectively. Center tap 20*c* and input terminal 62*b* terminate in lead 25*a* to ensure the generation of a negative trigger pulse whenever positive polarity coincidence between a polyphase component and the control signal occurs with respect to the relative magnitudes appearing on common lead 25*a***.

By way of example, the circuit operation is more readily understood in which the polyphase power received by the wye transformer 10 takes the form of a three-phase 60 Hertz signal. A single component of the three-phase power, also at 60 Hertz, is impressed across coupling transformer **20*a* and charges charging capacitor 28 as well as providing biasing potentials to both of the internal trigger units 23 and 24. A control signal 60*a* of lesser frequency, say 10 to 40 Hertz, is fed into the trigger circuit via input terminals 62*a*, 62*b*, and 62*c***.

When subcomponent **12*a* positively biases internal trigger unit 23 and control signal 60*a* is positive, transistors 23*a* and 23*b* conduct to commence charging a charging capacitor 25. As the charge achieves a predetermined magnitude sufficient to initiate conduction across a programmed unijunction transistor 26, SCR 27 is gated into forward conduction. It should be noted that the rate of charge on capacitor 25 is dependent on the relative amplitude of control frequency 60***a*. A greater magnitude causes a trigger gating pulse 12*c* to occur earlier in the impressed polyphase component 12 to produce composite waveform 70 approximating 60*a*.

As the SCR is gated, the charge accumulated on charging capacitor 28 flows in a burst through windings of a coupling transformer 22*b* to produce a negative trigger pulse 12*c* at trigger pulse output terminal 22*a*. The trigger pulse being coupled to gate 21*a* on bidirectional semiconductor 21, causes conduction across the semiconductor having a waveform of 12*d*. In a similar manner, trigger circuits 32 and 42 generate trigger pulses 13*c* and 14*c* to ensure the passing of signal components 13*d* and 14*d*.

Positive excursions of shifted subcomponent 12*b* do not cause the generation of a critical charge on capacitor 25 necessary to break down unijunction transistor 26 since the base of transistor 24*a* is negative with respect to lead 25*a* while the control signal fed to input terminal 62*a* is positive with respect to the control signal appearing at terminal 62*c*.

As the polarity of control signal 60*a* reverses across terminals 62*a* and 62*c*, the inverse of the aforementioned occurs, in that, now, input terminal 62*c* passes a positive control signal to the base of transistor 24*a* with respect to the signal on lead 25*a*. Transistor 24*b*, being forward biased by the positive portion of 12*b*, charges charging capacitor 25 to effect the ultimate breakdown of programmed unijunction transistor 26 and the gating of SCR 27, as outlined above. Now, only the 180° shifted subcomponent 12*b* causes the generation of an accumulation of a charge on capacitor 28 that produces the unipolar trigger pulse, 12*e* for example, when the SCR is gated.

Relative polarity coincidence between subcomponent 12*b* and control frequency 60*a* results in the gating of the negative swings of polyphase component 12 while the control frequency is negative, or appears to be positive on terminal 62*c*.

Similar actuation of trigger circuits 32 and 42 sequentially generates the gating of their respectively associated polyphase components 13 and 14 to produce the composite waveform shown, in part, by the portions 12*d*, 13*d*, and 14*d* and 12*f*, 13*f*, and 14*f* when coupling transformer 61 supplies a control frequency 60*a* to the other trigger circuits via terminals 63*a*, 63*b*, and 63*c* and 64*a*, 64*b*, and 64*c*.

Filtering the average values of the portions produces a composite waveform having substantially the same characteristics as the control frequency.

Employing single bidirectional semiconductors ensures greater reliability since duplicate switching branches requiring an excessive amount of components are eliminated as well as duplicate trigger circuits.

Obviously, many modifications and variations of the present invention are possible in the light of the above teachings, and, it is therefore understood that within the scope of the disclosed inventive concept, the invention may be practiced otherwise than as specifically described.

What is claimed is:

1. An apparatus having a reduced amount of components for converting polyphase power into a composite signal comprising:

means inductively receiving said polyphase power including a plurality of branches, each having a component of said power shifted in phase from one another, impressed thereacross;

a source of control frequency;

a plurality of trigger circuits each respectively coupled to a separate branch to receive its impressed component, and, all said trigger circuits connected to receive said control frequency, each trigger circuit including, a charging capacitor, a first trigger unit coupled to said charging capacitor for charging it in proportion to the negative polarity coincidence between said impressed component and said control frequency, a second trigger unit coupled to said charging capacitor for charging it in proportion to the positive polarity coincidence between said impressed component and said control frequency, a unijunction transistor coupled to said charging capacitor being actuated to generate a gating pulse when the charge on said charging capacitor reaches a predetermined value, and a silicon controlled rectifier having its gate connected to said unijunction transistor responsive to said gating pulse to generate a negative unipolar trigger pulse;

only one bidirectional semiconductor serially interposed in each said branch having its gate connected to receive said negative unipolar trigger pulse to bidirectionally conduct said component; and an adding means forming said composite signal from all the components at a frequency lower than either of said components.